US008279604B2

(12) United States Patent
Jones et al.

(10) Patent No.: US 8,279,604 B2
(45) Date of Patent: Oct. 2, 2012

(54) COOLING SYSTEM FOR CYLINDRICAL ANTENNA

(75) Inventors: Daniel P. Jones, Tampa, FL (US); Millage G. Burnsed, Saint Petersburg, FL (US); Carlos R. Costas, Brandon, FL (US)

(73) Assignee: Raytheon Company, Waltham, MA (US)

( * ) Notice: Subject to any disclaimer, the term of this patent is extended or adjusted under 35 U.S.C. 154(b) by 238 days.

(21) Appl. No.: 12/851,289

(22) Filed: Aug. 5, 2010

(65) Prior Publication Data

US 2012/0033383 A1 Feb. 9, 2012

(51) Int. Cl.
*H05K 7/20* (2006.01)

(52) U.S. Cl. ........ 361/703; 361/689; 361/690; 361/695; 165/80.3; 165/104.33

(58) Field of Classification Search ........................ None
See application file for complete search history.

(56) References Cited

U.S. PATENT DOCUMENTS

| | | | | | |
|---|---|---|---|---|---|
| 3,023,264 | A * | 2/1962 | Allison | 174/395 |
| 4,094,937 | A | 6/1978 | Bodick et al. | |
| 4,285,027 | A | 8/1981 | Mori et al. | |
| 4,528,615 | A * | 7/1985 | Perry | 361/722 |
| 4,851,856 | A | 7/1989 | Altoz | |
| 5,735,847 | A | 4/1998 | Gough et al. | |
| 5,829,519 | A | 11/1998 | Uthe | |
| 5,831,830 | A * | 11/1998 | Mahler | 361/704 |
| 5,913,888 | A | 6/1999 | Steinmeyer et al. | |
| 6,118,662 | A * | 9/2000 | Hutchison et al. | 361/704 |
| 6,292,556 | B1 * | 9/2001 | Laetsch | 379/338 |
| 6,404,637 | B2 * | 6/2002 | Hutchison et al. | 361/704 |
| 6,778,389 | B1 * | 8/2004 | Glovatsky et al. | 361/690 |
| 6,862,979 | B1 | 3/2005 | Silvestrini | |
| 6,865,085 | B1 * | 3/2005 | Ferris et al. | 361/721 |
| 7,061,446 | B1 | 6/2006 | Short, Jr. et al. | |
| 7,263,836 | B2 | 9/2007 | Gunawardana et al. | |
| 7,311,703 | B2 | 12/2007 | Turovskiy et al. | |
| 7,372,705 | B1 * | 5/2008 | Spivey et al. | 361/796 |
| 7,443,354 | B2 | 10/2008 | Navarro et al. | |
| 7,610,947 | B2 * | 11/2009 | Wang et al. | 165/80.3 |
| 7,885,037 | B2 * | 2/2011 | Konshak et al. | 360/133 |
| 8,004,844 | B2 * | 8/2011 | Kim et al. | 361/716 |
| 2005/0015081 | A1 | 1/2005 | Turovskiy et al. | |
| 2005/0149010 | A1 | 7/2005 | Turovskiy et al. | |
| 2005/0257533 | A1 | 11/2005 | Gunawardana et al. | |
| 2007/0035448 | A1 | 2/2007 | Navarro et al. | |
| 2008/0135217 | A1 | 6/2008 | Turovskiy et al. | |
| 2009/0084527 | A1 | 4/2009 | Rummel et al. | |
| 2009/0138005 | A1 | 5/2009 | Prakash et al. | |

FOREIGN PATENT DOCUMENTS

DE 40 30 796 A1 9/1990

OTHER PUBLICATIONS

Communication from European Patent Office, Extended Search Report for Application No. 11168524.4-2220, Sep. 30, 2011.

* cited by examiner

*Primary Examiner* — Boris Chervinsky

(57) ABSTRACT

According to one embodiment, an antenna cooling system, comprises a first cylinder and a second cylinder substantially concentric to the first cylinder. The first and second cylinders form a chamber between the first cylinder and the second cylinder. The chamber is configured to receive a fluid flow. A plurality of fins are disposed within the chamber and rigidly coupled to the first cylinder and the second cylinder. The plurality of fins are configured to transmit thermal energy to the fluid flow. A plurality of ports are coupled to the second cylinder. Each port is configured to receive an antenna unit.

20 Claims, 17 Drawing Sheets

COOLING SYSTEM FOR CYLINDRICAL ANTENNA

TECHNICAL FIELD OF THE DISCLOSURE

This disclosure generally relates to antennas, and more particularly, to a cooling system for a cylindrical antenna.

BACKGROUND OF THE DISCLOSURE

Antennas may transmit or receive electromagnetic waves or signals. For example, antennas may convert electromagnetic radiation into electrical current, or vice versa. These antennas may generate heat during operation.

SUMMARY OF THE DISCLOSURE

According to one embodiment, an antenna cooling system, comprises a first cylinder and a second cylinder substantially concentric to the first cylinder. The first and second cylinders form a chamber between the first cylinder and the second cylinder. The chamber is configured to receive a fluid flow. A plurality of fins are disposed within the chamber and rigidly coupled to the first cylinder and the second cylinder. The plurality of fins are configured to transmit thermal energy to the fluid flow. A plurality of ports are coupled to the second cylinder. Each port is configured to receive an antenna unit.

Some embodiments of the present disclosure may provide numerous technical advantages. A technical advantage of one embodiment may include the ability to cool antenna elements by attaching them to a cylinder and providing a fluid through the cylinder. A technical advantage of one embodiment may also include the ability to minimize packaging size and weight by arranging antenna elements around the outside of a cylinder. A technical advantage of one embodiment may also include the ability to cool transmit/receive integrated microwave module (TRIMM) cards without interfering with the ability to add and remove TRIMM cards by attaching the TRIMM cards to the outside of a cylinder and providing a fluid to the inside of the cylinder. A technical advantage of one embodiment may also include the ability to cool antenna electronics by placing the antenna electronics inside a cylinder and providing a fluid to the outside of the cylinder.

Although specific advantages have been disclosed hereinabove, it will be understood that various embodiments may include all, some, or none of the disclosed advantages. Additionally, other technical advantages not specifically cited may become apparent to one of ordinary skill in the art following review of the ensuing drawings and their associated detailed description.

BRIEF DESCRIPTION OF THE DRAWINGS

A more complete understanding of embodiments of the disclosure will be apparent from the detailed description taken in conjunction with the accompanying drawings in which.

DETAILED DESCRIPTION OF EXAMPLE EMBODIMENTS

Although example implementations of embodiments of the invention are illustrated below, embodiments may be implemented using any number of techniques, whether currently known or not. Embodiments should in no way be limited to the example implementations, drawings, and techniques illustrated below. Additionally, the drawings are not necessarily drawn to scale.

Figure 1A:
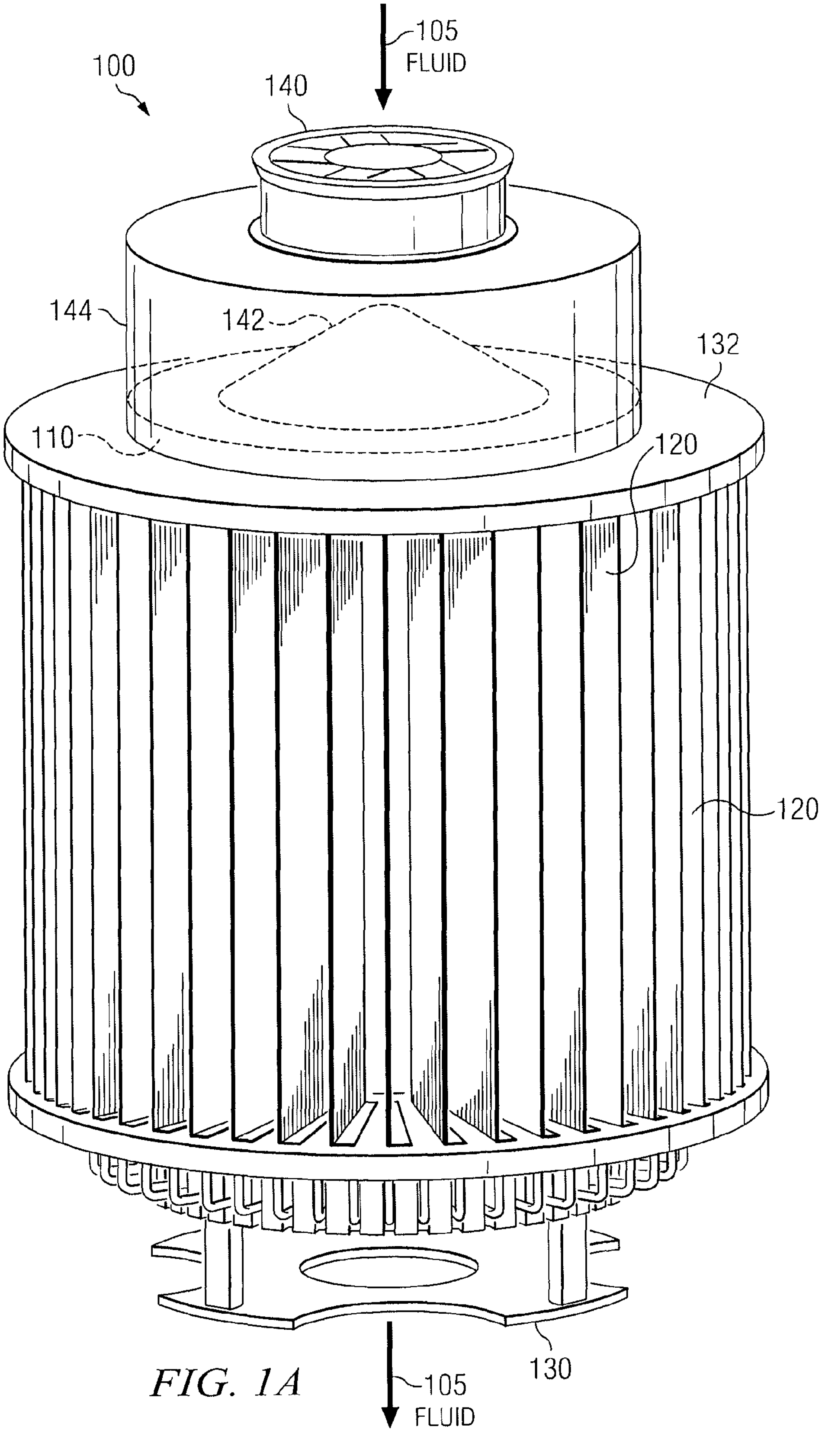
FIGS. 1A-1E show an antenna system according to one embodiment.
Figure 1B:
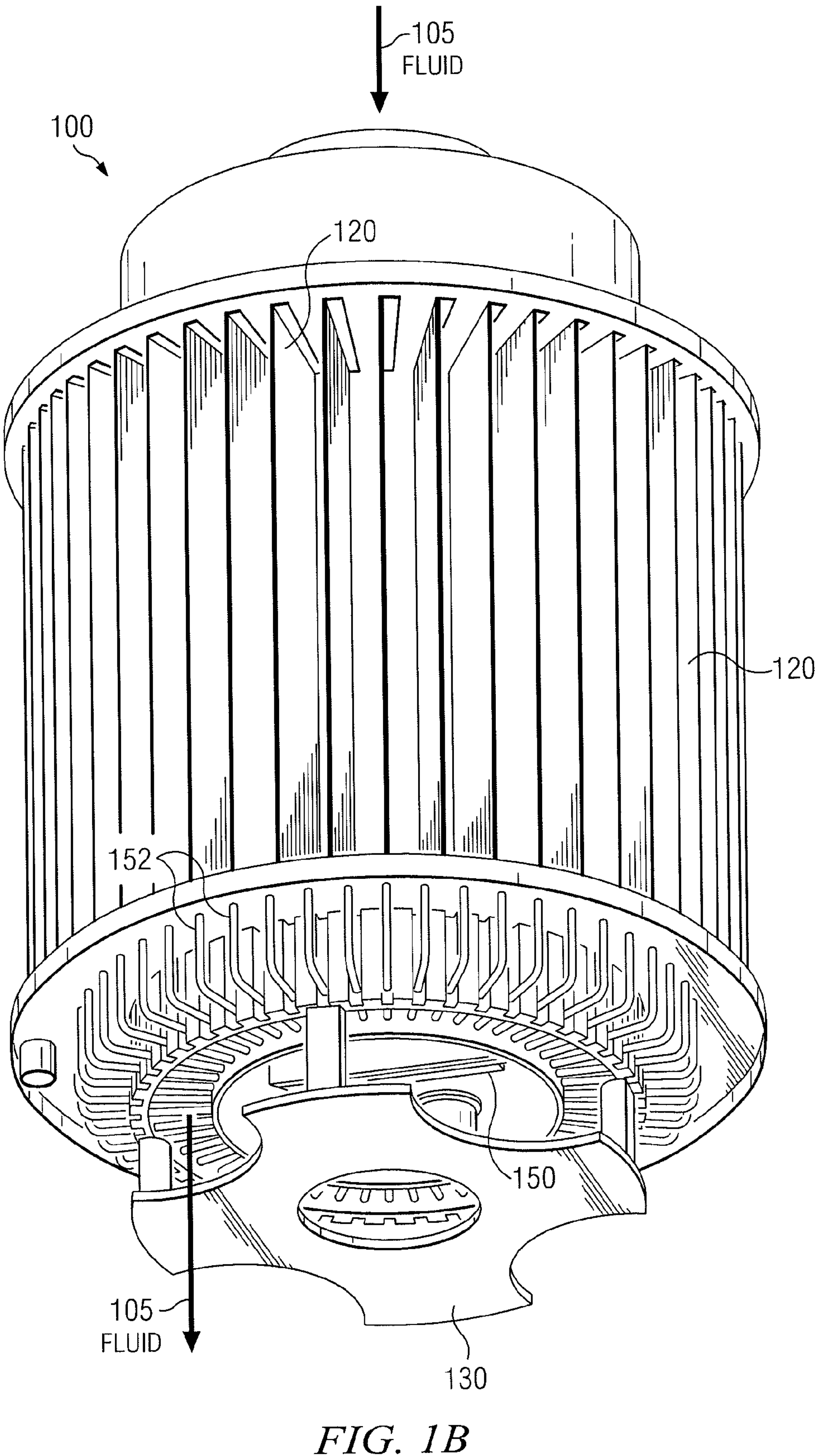
Figure 1C:
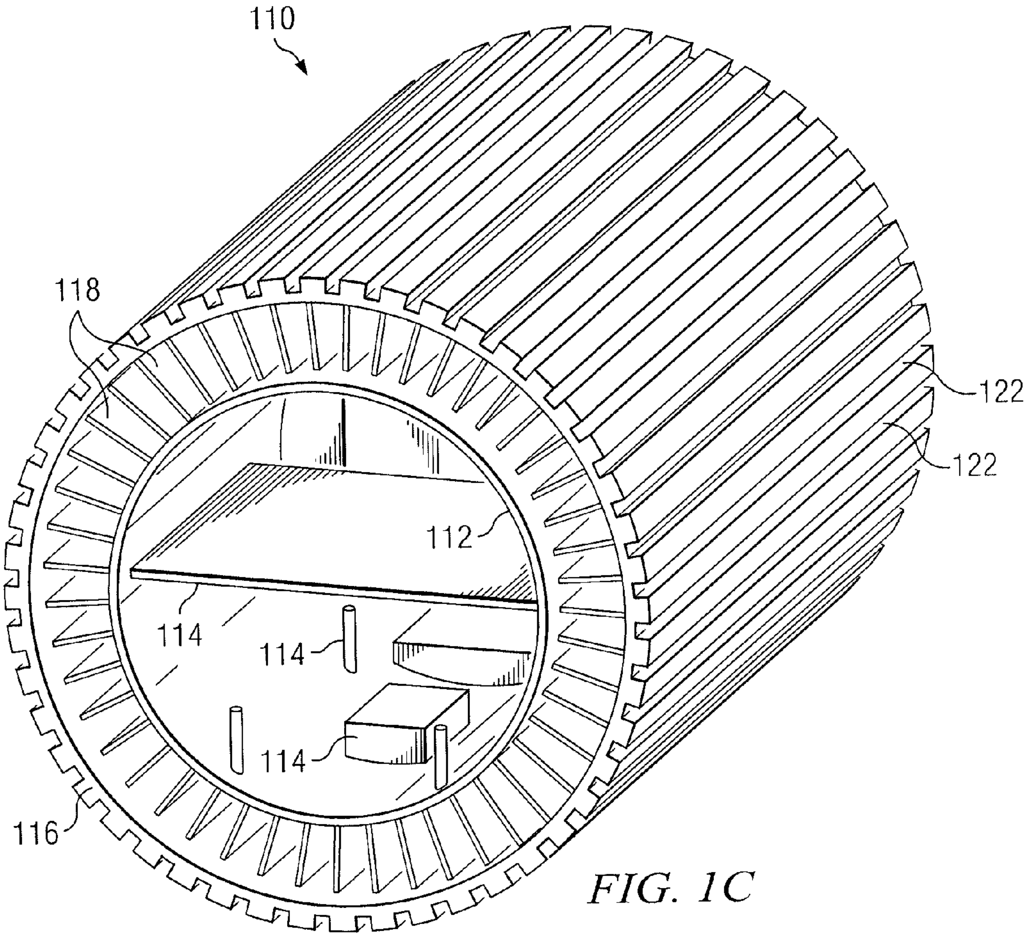
Figure 1D:
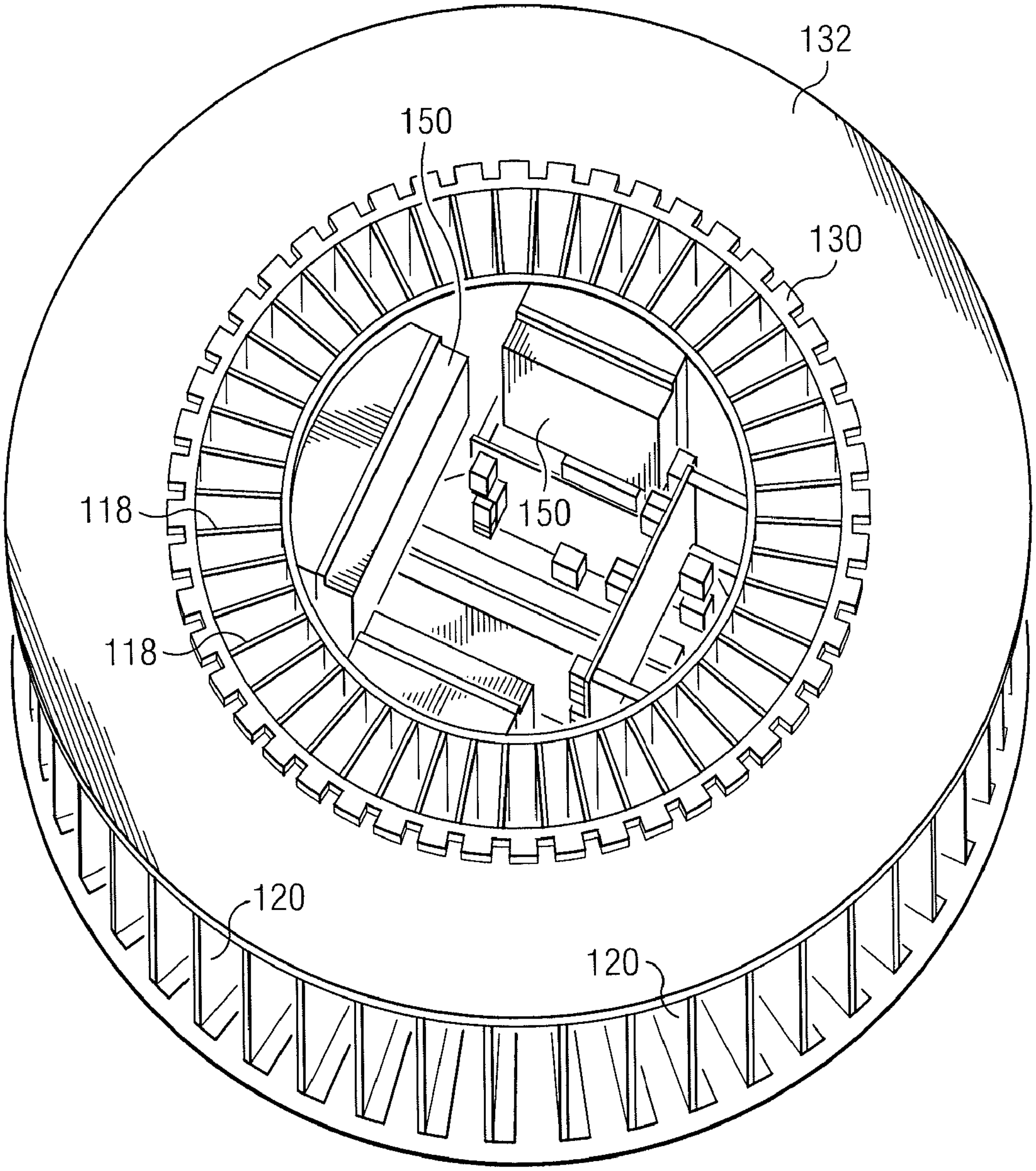
Figure 1E:
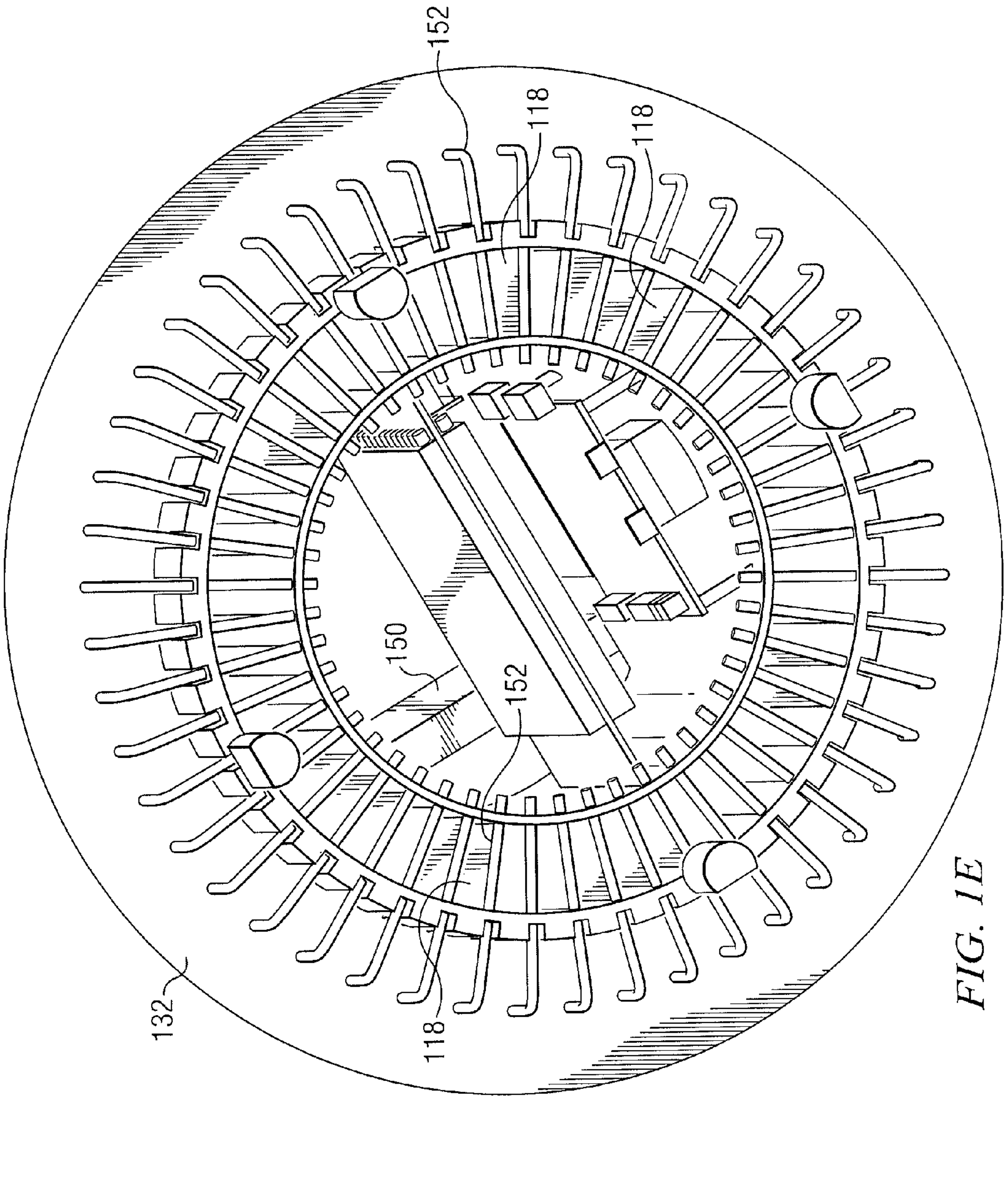

FIGS. 1A-1E show an antenna system 100 according to one embodiment. FIGS. 1A and 1B show perspective views of antenna system 100. FIG. 1C shows an example body 110 of antenna system 100. FIGS. 1D and 1E show cross-section views of antenna system 100.

As shown in FIGS. 1A and 1B, example antenna system 100 features body 110, one or more antenna boards 120, a base 130, a fan 140, an inner cylinder cover 142, a flow enclosure 144, antenna electronics 150, and feedlines 152. Teachings of certain embodiments recognize the capability to provide a fluid 105 flowing through body 110 and cool antenna boards 120 and/or antenna electronics 150.

Body 110 may comprise any suitable material. In some embodiments, body 110 is constructed from heat-conductive materials. In one example embodiment, body 110 comprises aluminum or another suitable metal. An example embodiment of body 110 is discussed in greater detail with regard to FIG. 1C. Body 110 may be of any suitable dimension. For example, in some embodiments, the height of body 110 is sized to correspond to the length of antenna boards 120. As an example, antenna boards 120 may have a length approximately equal to less than the height of body 110 (as measured from between antenna plates 132). For example, in one embodiment, if antenna boards 120 are approximately eight to ten inches long, then body 110 may be ten inches or higher.

In the example embodiment shown in FIGS. 1A and 1B, body 110 is rigidly coupled to base 130. Teachings of certain embodiments recognize that base 130 may allow antenna system 100 to be secured to any suitable structure, such as a building, vehicle, or mast. In some embodiments, however, body 110 is not rigidly coupled to base 130. For example, in one embodiment, body 110 is releasably coupled to base 130.

In this example antenna system 100, antenna boards 120 connect to the outside of body 110, antenna electronics 150 are disposed within body 110, and feedlines 152 electrically couple antenna boards 120 to antenna electronics 150. Antenna boards 120 may include any components configured to aid in transmitting and/or receiving electromagnetic waves or signals, such as RF signals or microwave signals. For example, in some embodiments, antenna boards 120 may comprise transmit/receive integrated microwave module (TRIMM) cards. Example antenna electronics 150 may include, but are not limited to, components operable to provide power and/or signals to or receive power and/or signals from antenna boards 120. Examples of antenna electronics 150 include power supplies, EMI filters, and RF dividers. In one example, antenna electronics 150 includes a power supply that provides power to antenna boards 120. Feedlines 152 may include any suitable transmission lines, such as copper (or other metal) transmission lines. In some embodiments, antenna system 100 does not include feedlines 152. For example, in some embodiments, antenna boards 120 communicate with antenna electronics 150 solely through antenna ports 122.

As shown in FIG. 1C, example body 110 may include an inner cylinder 112 and an outer cylinder 116. Inner cylinder 112 and outer cylinder 116 may form a chamber through which fluid 105 may flow. Teachings of certain embodiments recognize that this chamber may receive a flow of fluid 105 in any suitable direction (such as providing fluid 105 to body 110 from either open end) and at any suitable speed. For example, in some embodiments, a flow of fluid 105 may include stagnant air within the chamber.

Fins 118 may be disposed between inner cylinder 112 and outer cylinder 116. Inner cylinder 112 may include mounting structures 114 for mounting and/or securing antenna electronics 150. Outer cylinder 116 may include antenna ports 122 configured to receive antenna boards 120. Teachings of certain embodiments recognize the ability to provide fluid 105 between inner cylinder 112 and outer cylinder 116 to cool antenna boards 120 and/or antenna electronics 150. For example, in some embodiments, fins 118 may increase transfer of thermal energy between fluid 105 and antenna boards 120 and/or electronics 150.

In some embodiments, inner cylinder 112 and/or outer cylinder 116 are right circular cylinders. In other embodiments, inner cylinder 112 and/or outer cylinder 116 are not circular cylinders (such as oval, elliptic, oblique, or parabolic cylinders) and are not right angle cylinders (such as cylinders with an angle of less than or greater than 90 degrees). Teachings of certain embodiments recognize that any suitable shapes may be used, such as spheres or three-dimensional quadrilaterals.

Inner cylinder 112, mounting structures 114, and outer cylinder 116 may comprise any suitable material. In some embodiments, inner cylinder 112, mounting structures 114, and outer cylinder 116 are constructed from heat-conductive materials. In one example embodiment, inner cylinder 112, mounting structures 114, and outer cylinder 116 comprise aluminum or another suitable metal. Teachings of certain embodiments recognize that antenna electronics 150 may be secured to mounting structures 114 within inner cylinder 112.

Fins 118 may comprise any suitable material. In some embodiments, fins 118 are constructed from heat-conductive materials. In one example embodiment, fins 118 comprise aluminum or another suitable metal. In some embodiments, fins 118 are vacuum brazed. Teachings of certain embodiments recognize the capability to provide fluid 105 past fins 118 and transfer thermal energy between antenna system 100 and fluid 105.

Antenna system 100 may include any suitable number of fins 118, such as a number equal to the number of antenna ports 122. In some embodiments, fins 118 may be separated by equal distances. In other embodiments, fins may not be separated by equal distances. In one example, fins 118 may be spaced closer together near antenna boards 120. Fins 118 may be of any suitable thickness, such as a thickness approximately equal to the thickness of antenna boards 120. In some embodiments, thickness of fins 118 may be size to optimize thermal energy transfer between flow 105 and fins 118. In the illustrated embodiment, fins 118 are perpendicular to inner cylinder 112 and outer cylinder 116. However, teachings of certain embodiments recognize that fins 112 may be oriented at any angle relative to inner cylinder 112 and outer cylinder 116. For example, in some embodiments, the angle between fins 112 and inner cylinder 112 may vary throughout the height of body 110.

Additionally, although the embodiment shown includes fins 118, teachings also recognize embodiments without fins 118. For example, in some embodiments, fluid 105 may exchange thermal energy with inner cylinder 112 and/or outer cylinder 116 without fins 118.

Antenna ports 122 may include any opening suitable for receiving antenna boards 120. For example, in some embodiments, antenna boards 120 are TRIMM cards. Antenna ports 122 may be slots configured to receive TRIMM cards. Antenna ports 122 include electrical connections to antenna boards 120. For example, in some embodiments, antenna ports 122 may electrically couple antenna boards 120 to antenna electronics 150 in lieu of, or in addition to, feedlines 152.

Returning to FIGS. 1A and 1B, in some embodiments, fan 140 provides fluid 105. Examples of fluid 105 may include, but are not limited to, gases (such as air) and liquids (such as water and liquid refrigerants). In one example embodiment, fluid 105 is ambient air that includes particulates or debris, such as sand, dirt, or trash. Accordingly, teachings of certain embodiments recognize that cylinder cover 142 may prevent fluid 105 from entering inner cylinder 112 and interfering with performance of antenna electronics 150. In some embodiments, flow enclosure 144 may direct flow 105 towards body 110. Teachings of certain embodiments also recognize the capability to increase the fluid pressure within flow enclosure 144 and increase fluid flow efficiency.

As shown in FIGS. 1C-1E, in some embodiments, fins 118 may be aligned with antenna ports 122 and antenna boards 120. For example, in FIGS. 1C and 1E, each fin 118 connects to outer cylinder 116 aligned opposite from a corresponding antenna port 122. Teachings of certain embodiments recognize that aligning fins 118 with antenna ports 122 may improve thermal transfer between body 110 and antenna cards 120. Teachings of certain embodiments also recognize that aligning feedlines 152 parallel with fins 118 between inner cylinder 112 and outer cylinder 116 may reduce drag of fluid 105 flowing past feedlines 152. However, in other embodiments feedlines 152 are not parallel with corresponding fins 118, such as, for example, when the number of feedline 152 does not match the number of fins 118. For example, if an embodiment has ten feedlines 152 evenly spaced around body 110 and eight fins 118 also evenly spaced around body 110, then some of the feedlines 152 will not correspond to a fin 118. Feedlines 152 may also be arranged in any suitable manner to avoid contact with fluid 105.

In some embodiments, antenna plates 132 may be configured on one or both sides of antenna boards 120. In some embodiments, antenna plates 132 provide structural support to antenna boards 120. For example, in some embodiments, antenna boards 120 may include additional antenna ports 122 for receiving antenna boards 120. An example antenna plate 132 with antenna ports 122 will be discussed in greater detail with regard to FIG. 2C. In some embodiments, antenna plates 132 do not touch antenna boards 120. For example, if body 110 is higher than the length of antenna boards 120, then antenna plates 132 may not touch antenna boards 120.

Figure 2A:
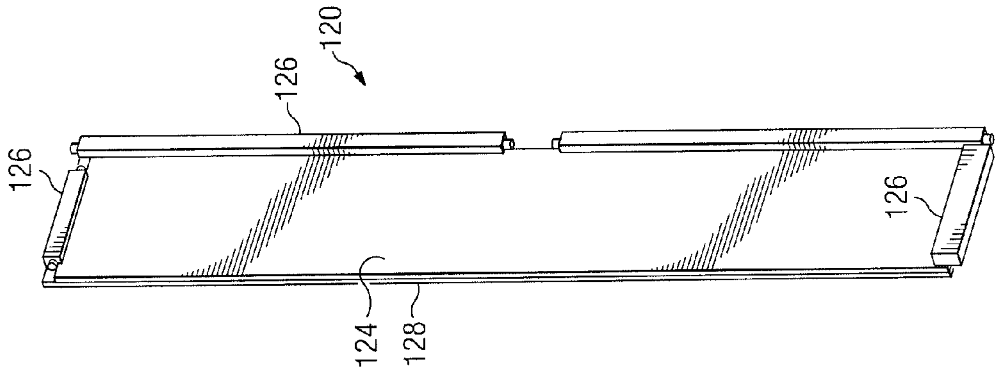
FIGS. 2A and 2B show example antenna boards according to one embodiment.
Figure 2B:
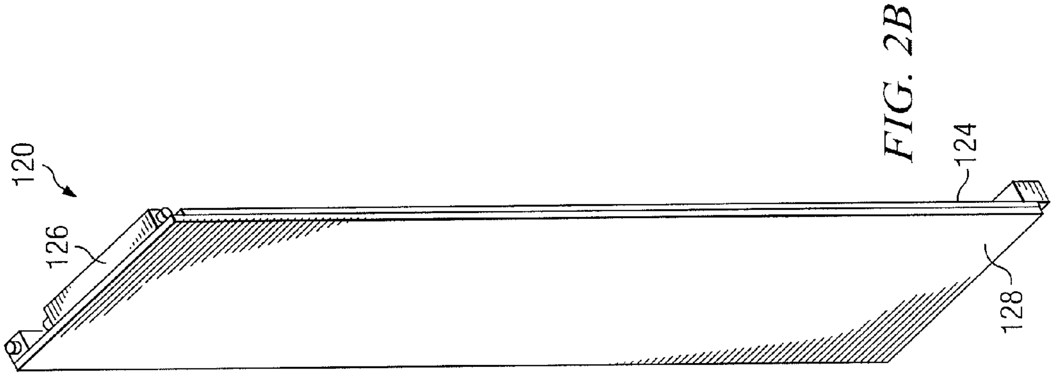

FIGS. 2A and 2B show example antenna boards 120 according to one embodiment. In this example embodiment, antenna boards 120 are TRIMM cards. In this example, the antenna board 120 includes an antenna card 124, connection pieces 126, a mounting board 128. Antenna card 124 may include any electronic component configured to aid in transmitting and/or receiving electromagnetic waves or signals. Connection pieces 126 may include any suitable components to physically and/or electronically couple antenna boards 120 to antenna ports 122. For example, in some embodiments, connection pieces 126 include copper traces for electrical communication with antenna ports 122. In some embodiments, connection pieces include wedges configured to match into locking grooves associated with antenna ports 122. Mounting board 128 may include any physical structure suitable for hosting antenna card 124 and/or connection pieces 126. In some embodiments, antenna card 124 and mounting board 128 are integrated into a common structure, such as a printed circuit board with various electronic components mounted to it.

Figure 2C:
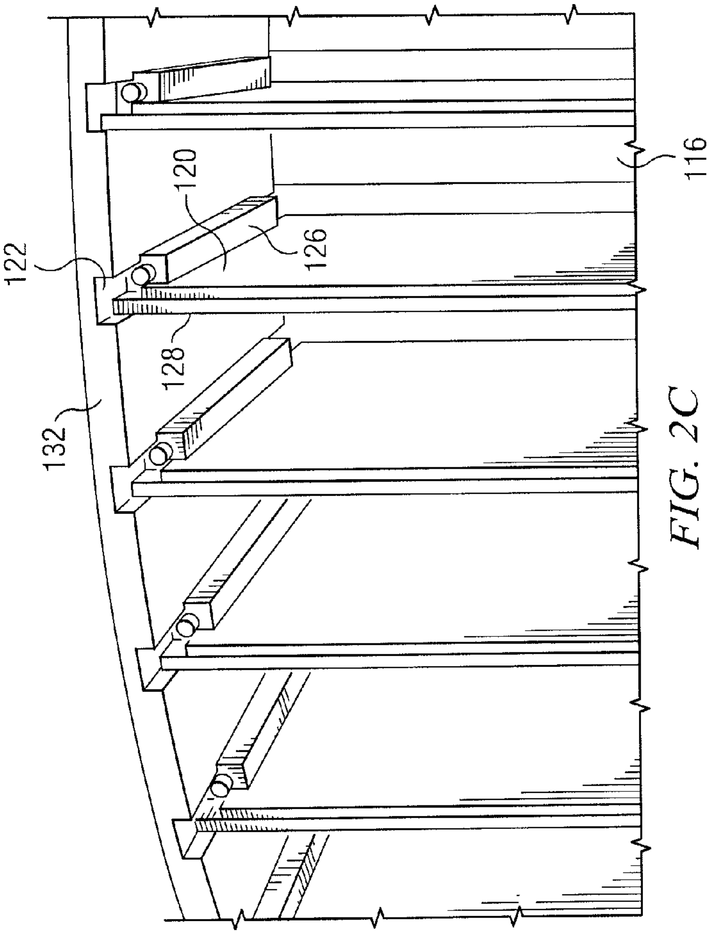
FIG. 2C shows the antenna board of FIGS. 2A and 2B connected to example antenna ports according to one embodiment.

FIG. 2C shows antenna board 120 connected to antenna ports 122 according to one embodiment. In this example, antenna ports 122 are configured on outer cylinder 118 and antenna plate 132. In this example, antenna board 120 electrically connects to antenna ports 122 on outer cylinder 118, and the antenna ports 122 on antenna plate 132 align and secure antenna boards 120.

In the example embodiments of FIGS. 1A-1E, antenna boards 120 are connected around the outside of body 110. Teachings of certain embodiments recognize that this configuration may allow antenna boards 120 to transmit and receive signals in multiple directions, such as above, below, and radiating outward. However, some antenna systems may only be concerned with transmitting and receiving signals in specified directions. Accordingly, teachings of certain embodiments recognize the ability to orient antenna boards 120 to maximize transmission and receipt of signals in specified directions.

Figure 3B:
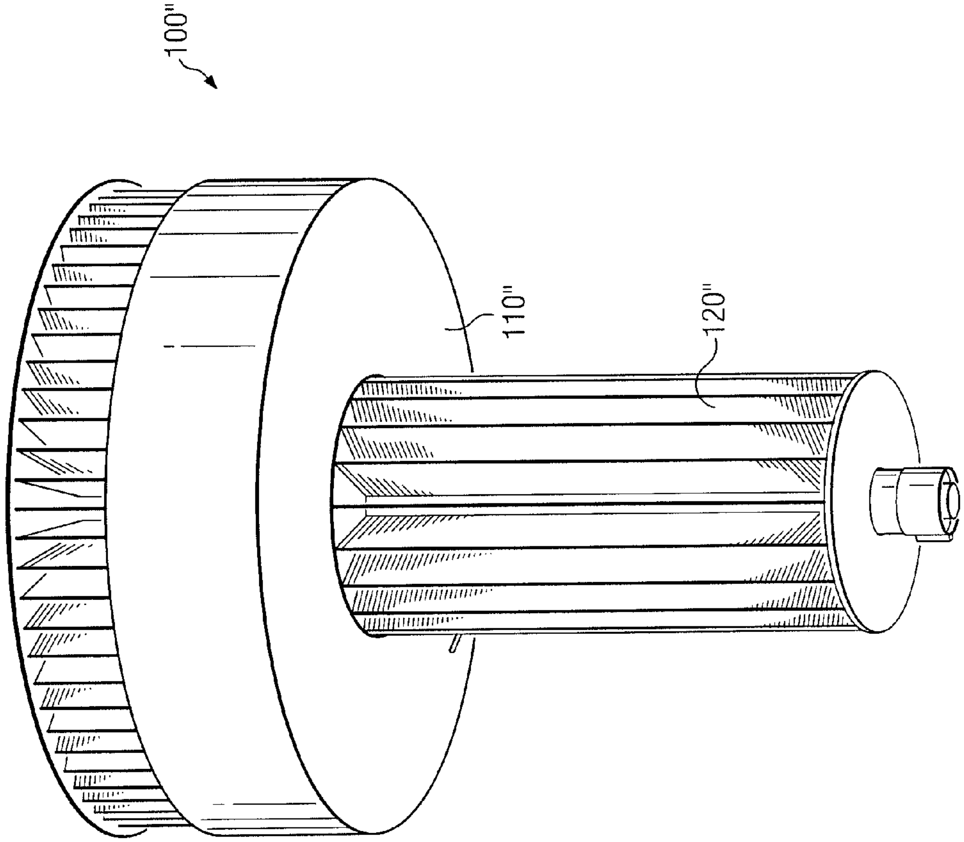
FIGS. 3A and 3B show antenna cooling systems according to two embodiments.
Figure 3A:
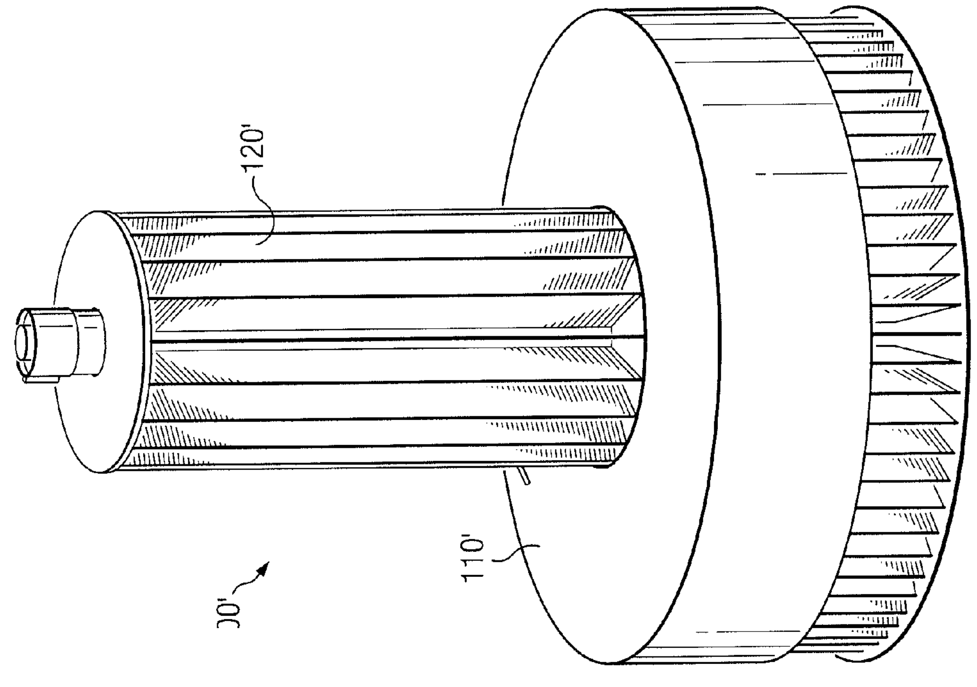

FIGS. 3A and 3B show antenna cooling systems 100' and 100" according to two embodiments. Antenna cooling system 100' features a body 110' and antenna boards 120'. Antenna cooling system 100" features a body 110" and antenna boards 120".

In FIG. 3A, antenna cooling system 100' is configured to transmit and receive signals above the antenna system 100'. In this example, body 110' may be smaller at the top of antenna system 100' to increase transmission and receipt of signals above antenna system 100'. In addition, body 110' may be larger at the bottom of antenna system 100' to store electronic components.

In FIG. 3B, antenna cooling system 100" is configured to transmit and receive signals below the antenna system 100". In this example, body 110" may be smaller at the bottom of antenna system 100" to increase transmission and receipt of signals below antenna system 100". In addition, body 110" may be larger at the top of antenna system 100" to store electronic components.

Figure 4A:
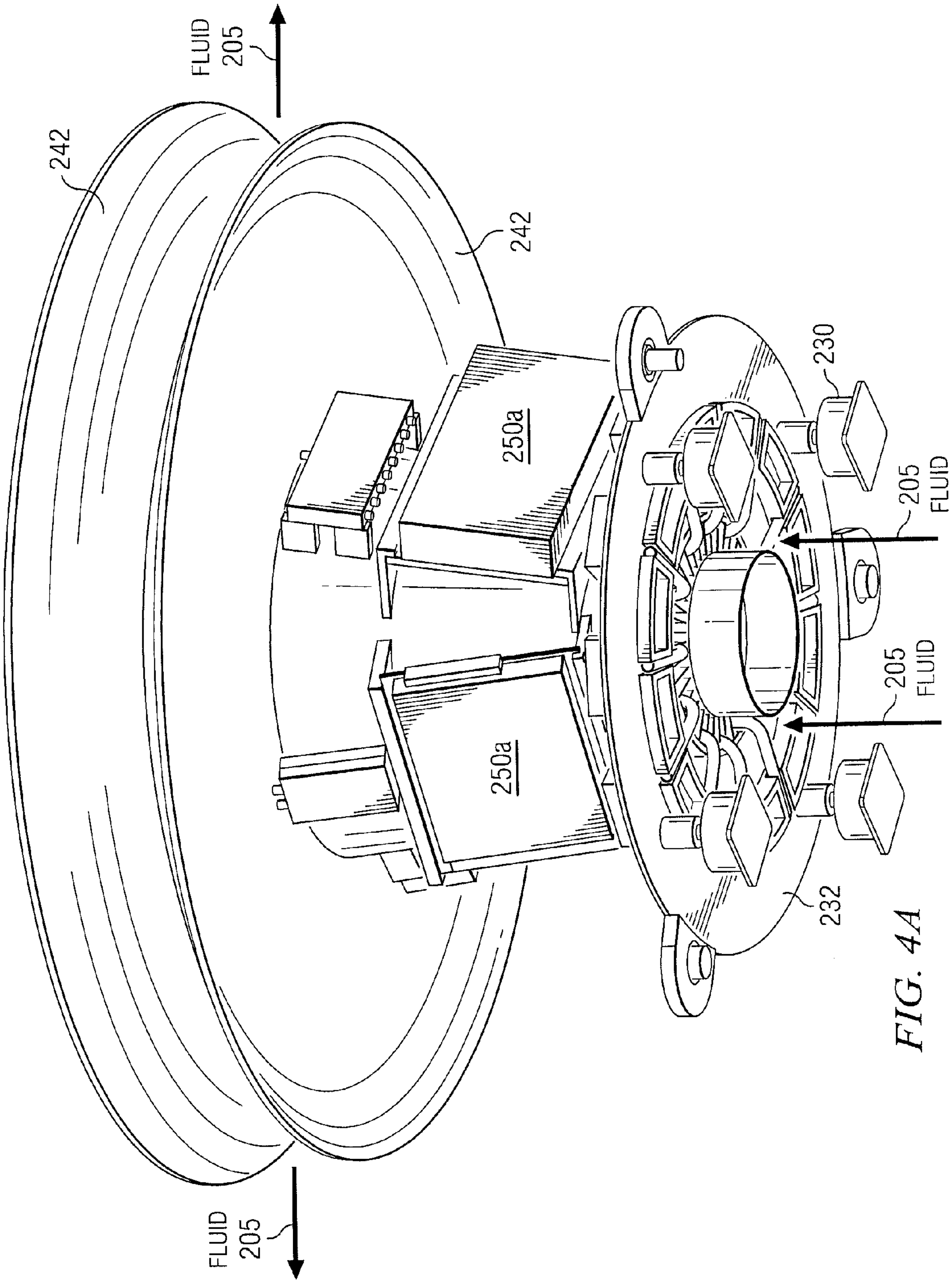
FIGS. 4A-4F and 5A-5C show another example antenna system according to one embodiment.
Figure 4B:
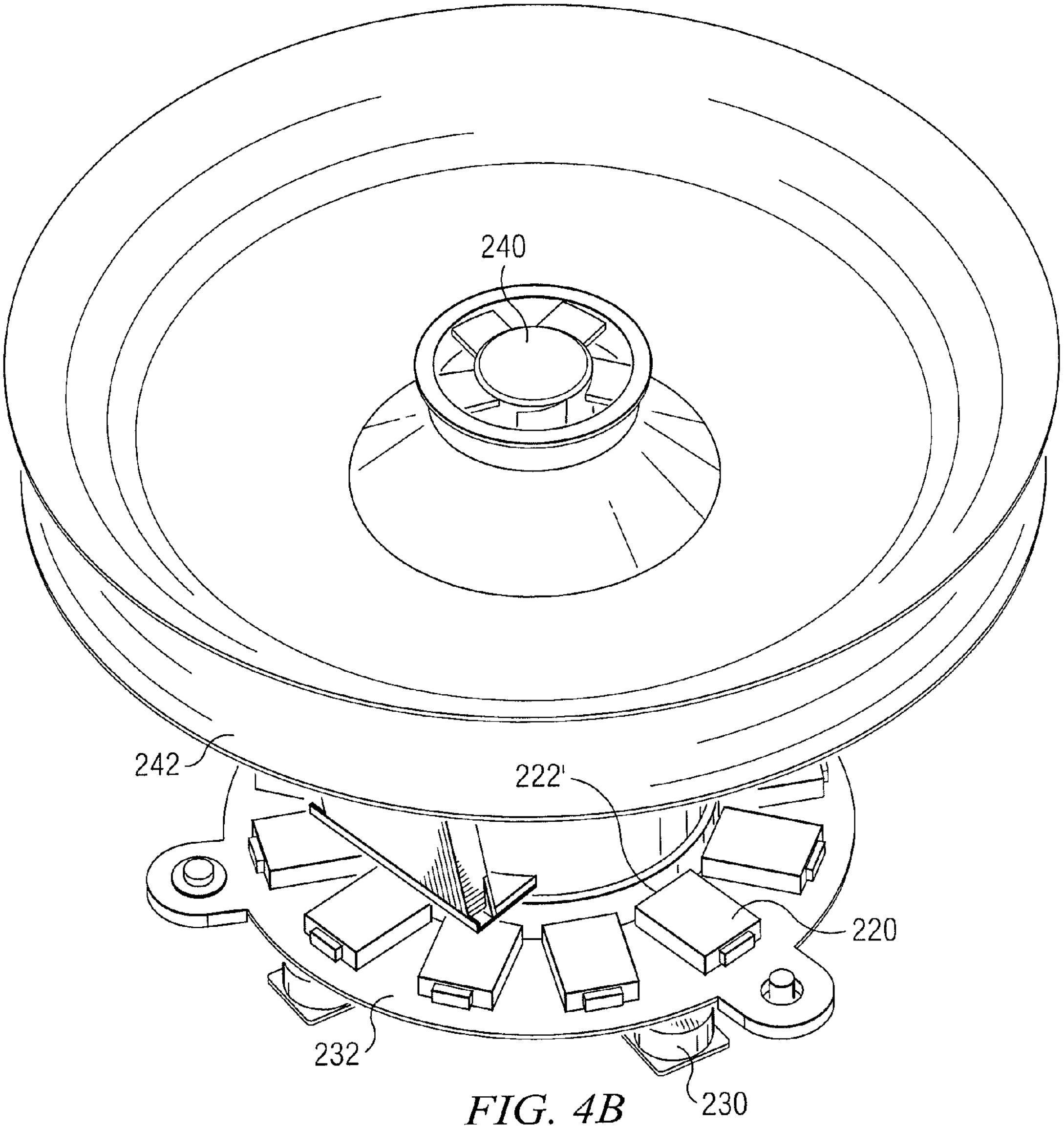
Figure 4C:
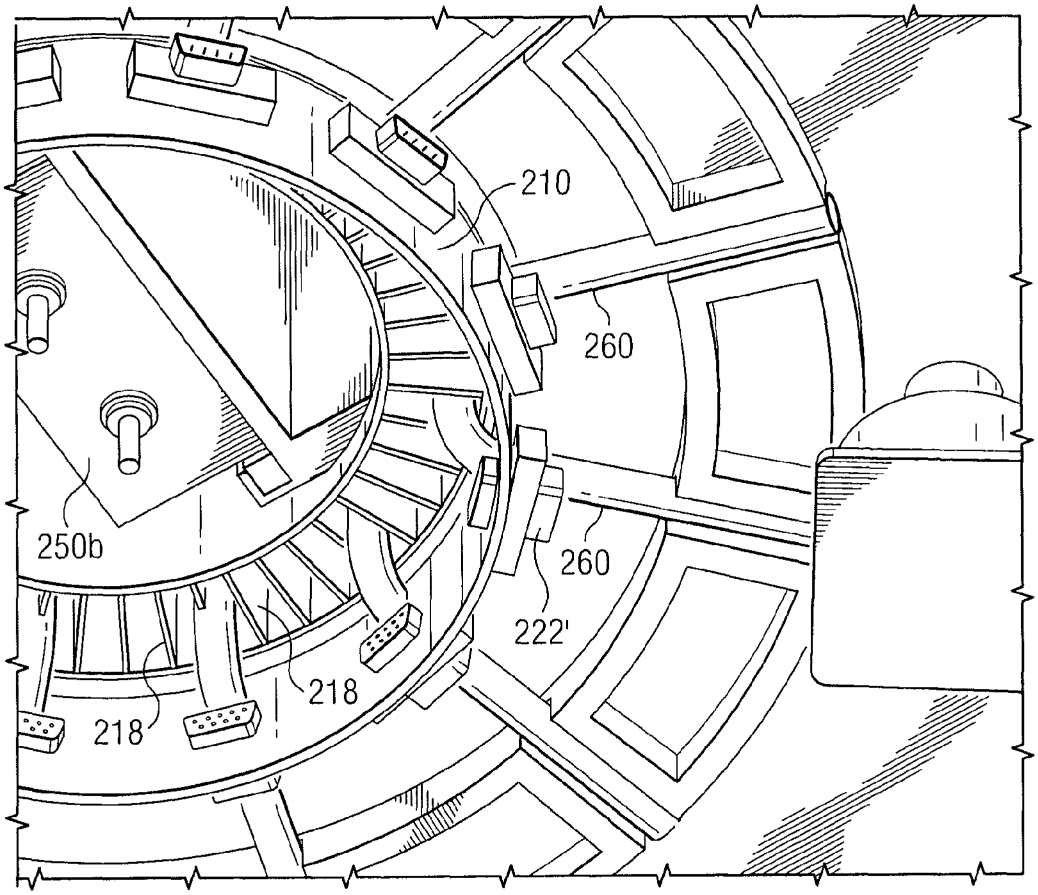
Figure 4D:
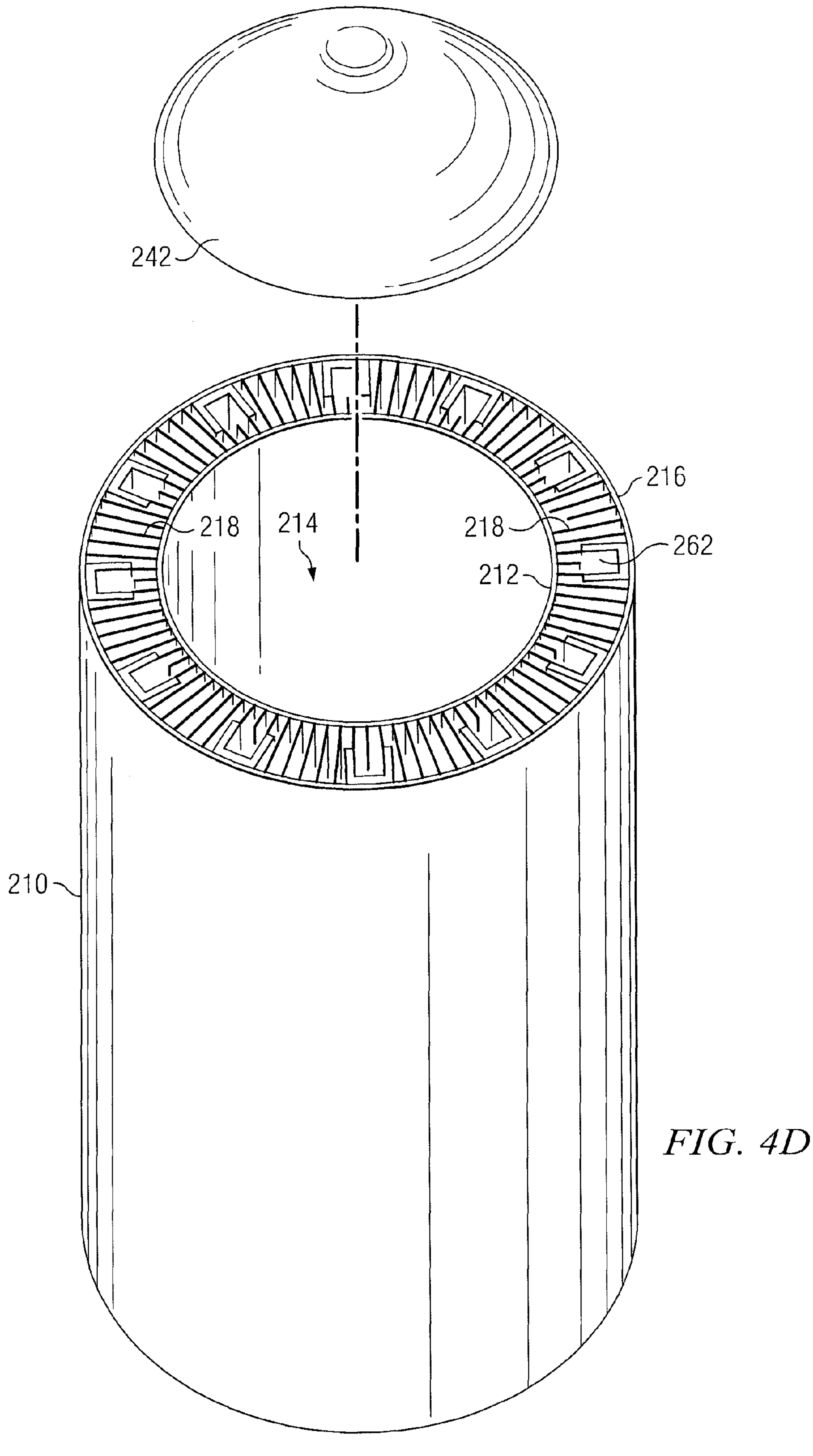
Figure 4E:
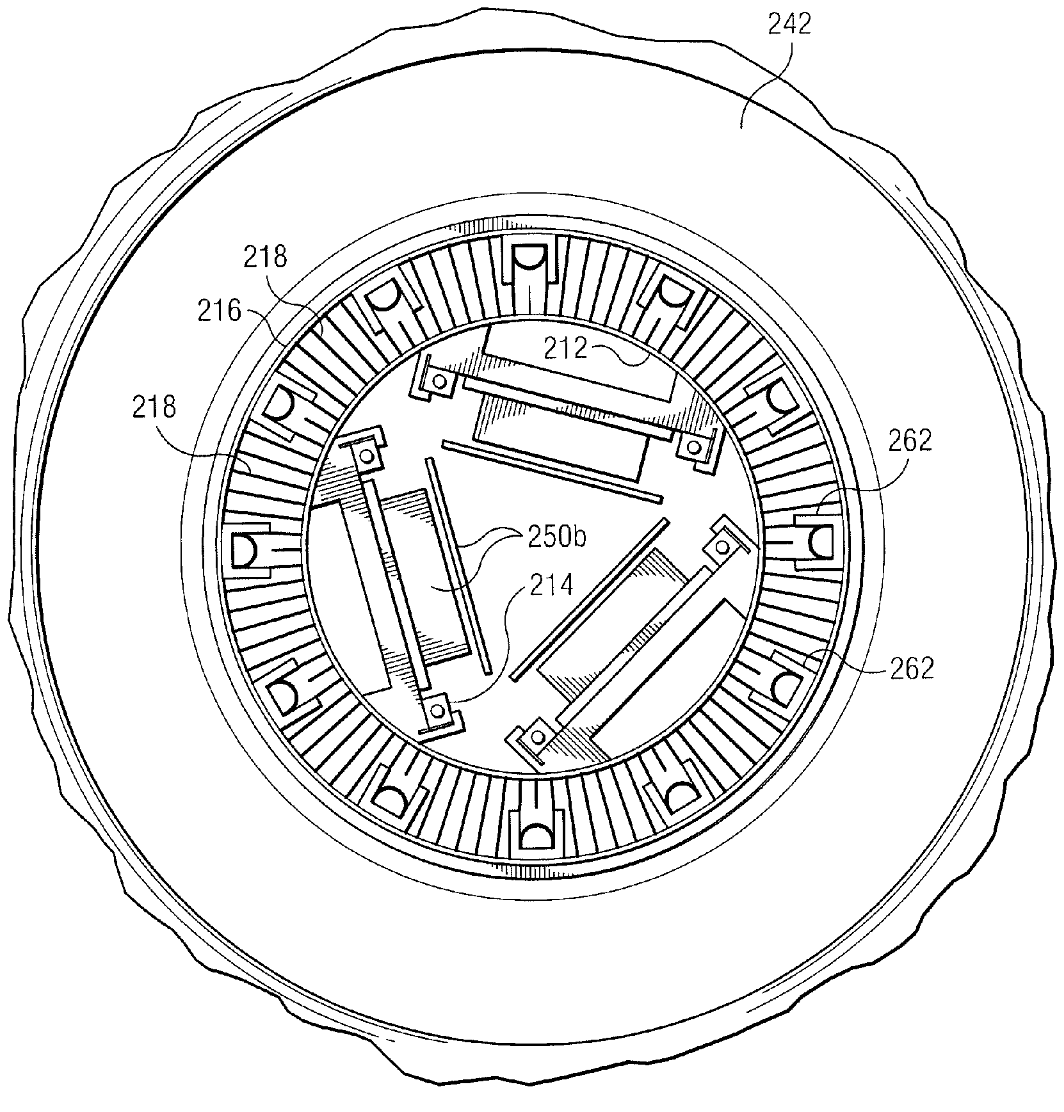
Figure 4F:
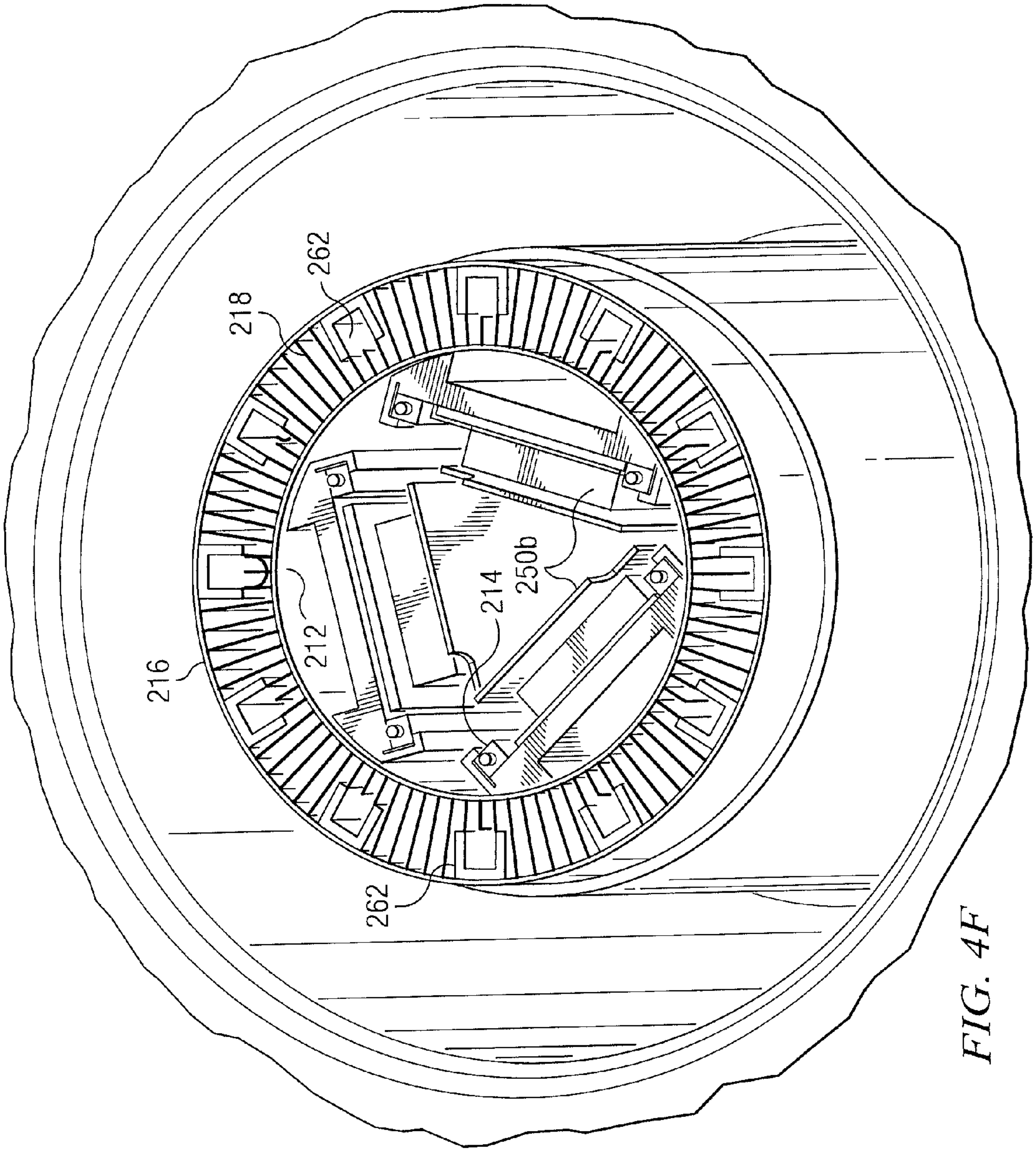

FIGS. 4A-4F show an antenna system 200 according to one embodiment. FIGS. 4A and 4B show perspective views of antenna system 200. FIG. 4C shows an underside view of antenna system 200. FIG. 4D shows an example body 210 of antenna system 200. FIG. 4E shows a cross-section view of antenna system 200. FIG. 4F shows a perspective cross-section view of antenna system 200.

In this example embodiment, antenna system 200 features body 210, antenna modules 220, a base 230, a fan 240, a flow diverter 242, exterior antenna electronics 250*a*, and interior electronics 250*b*. In this example, fluid 205 flows through body 210 and then out flow diverter 242 to cool antenna boards 220, exterior antenna electronics 250*a*, and/or interior electronics 250*b*. However, in some embodiments, fluid 205 flows into flow diverter 242 and then through body 210.

Body 210 may comprise any suitable material. In some embodiments, body 210 is constructed from heat-conductive materials. In one example embodiment, body 210 comprises aluminum or another suitable metal. An example embodiment of body 210 is discussed in greater detail with regard to FIG. 4D.

In the example embodiment shown in FIG. 2A, body 210 is rigidly coupled to base 230. Teachings of certain embodiments recognize that base 230 may allow antenna system 200 to be secured to any suitable structure, such as a building, vehicle, or mast.

As shown in FIGS. 4B and 4C, antenna modules 220 may be mounted outside of body 210. In this example, antenna modules 230 are mounted to antenna plate 232. In this example, antenna modules 220 may be electrically coupled to exterior antenna electronics 250*a* and/or interior electronics 250*b*. For example, in one embodiment, antenna modules 220 connect to antenna ports 222', which then connect to interior electronics 250*b*.

Example exterior antenna electronics 250*a* and interior electronics 250*b* may include, but are not limited to, components operable to provide power and/or signals to or receive power and/or signals from antenna boards 120. Examples of exterior antenna electronics 250*a* and interior electronics 250*b* include power supplies, EMI filters, and RF dividers. In one example, a power supply inside body 210 provides power to antenna boards 220 through antenna ports 222'. In another example, RF dividers are stored outside body 210, and EMI filters and power supplies are stored inside body 210.

As shown in FIG. 4D, example body 210 may include an inner cylinder 212 and an outer cylinder 216. Inner cylinder 212 and outer cylinder 216 may form a chamber through which fluid 205 may flow. Teachings of certain embodiments recognize that this chamber may receive a flow of fluid 205 in any suitable direction and at any suitable speed. For example, in some embodiments, a flow of fluid 205 may include stagnant air within the chamber.

Inner cylinder 212 may include mounting structures 214 for mounting and/or securing interior electronics 250*b*. External electronics 250*a* may be mounted and/or secured to outer cylinder 216.

Fins 218 and heat pipes 262 may be disposed between inner cylinder 212 and outer cylinder 216. In this example, heat pipes 262 also extend out of body 210 and are coupled to antenna plate 232, where heat pipes 262 are in thermal communication with antenna modules 220.

Teachings of certain embodiments recognize the ability to provide fluid 105 between inner cylinder 112 and outer cylinder 116 to cool antenna modules 220, external electronics 250*a*, and/or interior electronics 250*b*. For example, in some embodiments, fins 118 may increase transfer of thermal energy between fluid 105 and antenna modules 220, external electronics 250*a*, and/or interior electronics 250*b*.

Additionally, although the embodiment shown includes fins 218, teachings also recognize embodiments without fins 218. For example, in some embodiments, fluid 105 may exchange thermal energy with inner cylinder 212 and/or outer cylinder 216 without fins 218.

In some embodiments, inner cylinder 212 and/or outer cylinder 216 are right circular cylinders. In other embodiments, inner cylinder 212 and/or outer cylinder 216 are not circular cylinders and are not right circular cylinders. Teachings of certain embodiments recognize that any suitable shapes may be used, such as spheres and three-dimensional quadrilaterals.

Inner cylinder 212, mounting structures 214, and outer cylinder 216 may comprise any suitable material. In some embodiments, inner cylinder 212, mounting structures 214, and outer cylinder 216 are constructed from heat-conductive materials. In one example embodiment, inner cylinder 212, mounting structures 214, and outer cylinder 216 comprise aluminum or another suitable metal. Teachings of certain embodiments recognize that interior electronics 250*b* may be secured to mounting structures 214 within inner cylinder 212.

Fins 218 may comprise any suitable material. In some embodiments, fins 218 are constructed from heat-conductive materials. In one example embodiment, fins 118 comprise aluminum or another suitable metal. In some embodiments, fins 218 are vacuum brazed. Teachings of certain embodiments recognize the capability to provide fluid 205 past fins 218 and transfer thermal energy between antenna system 200 and fluid 205.

Additional examples of body 210, inner cylinder 212, mounting equipment 214, outer cylinder 216, fins 218, and antenna ports 222 may include features from body 110, inner cylinder 112, mounting equipment 114, outer cylinder 116, fins 118, and antenna ports 122.

In some embodiments, fan 240 provides fluid 205. In the example antenna system 200, fan 240 draws fluid 205 up through body 210. Examples of fluid 205 may include, but are not limited to, gases (such as air) and liquids (such as water and liquid refrigerants).

Figure 5A:
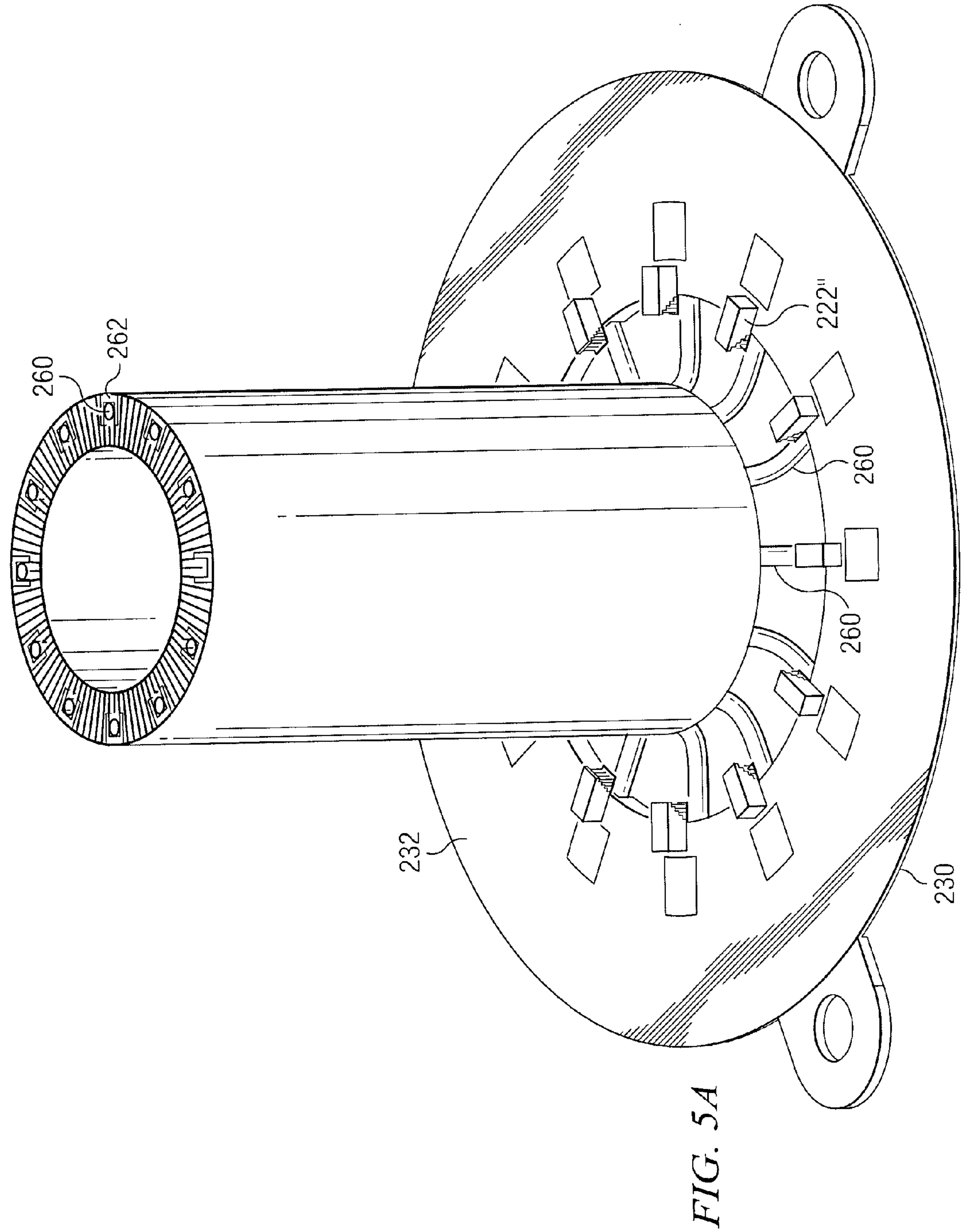
Figure 5B:
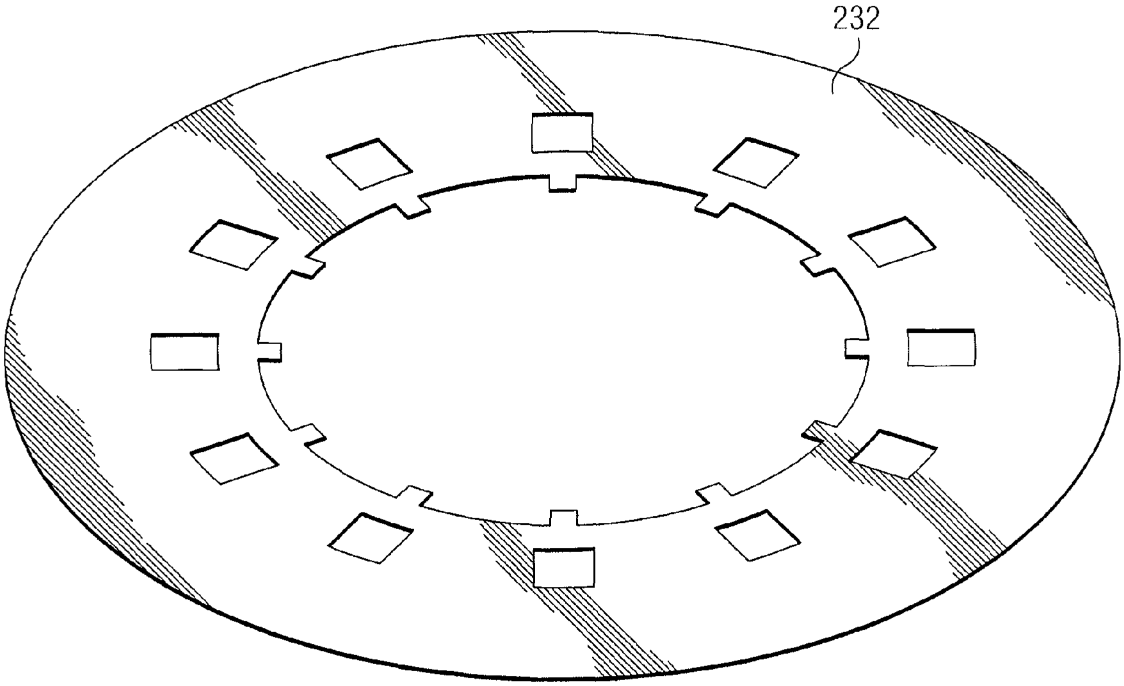
Figure 5C:
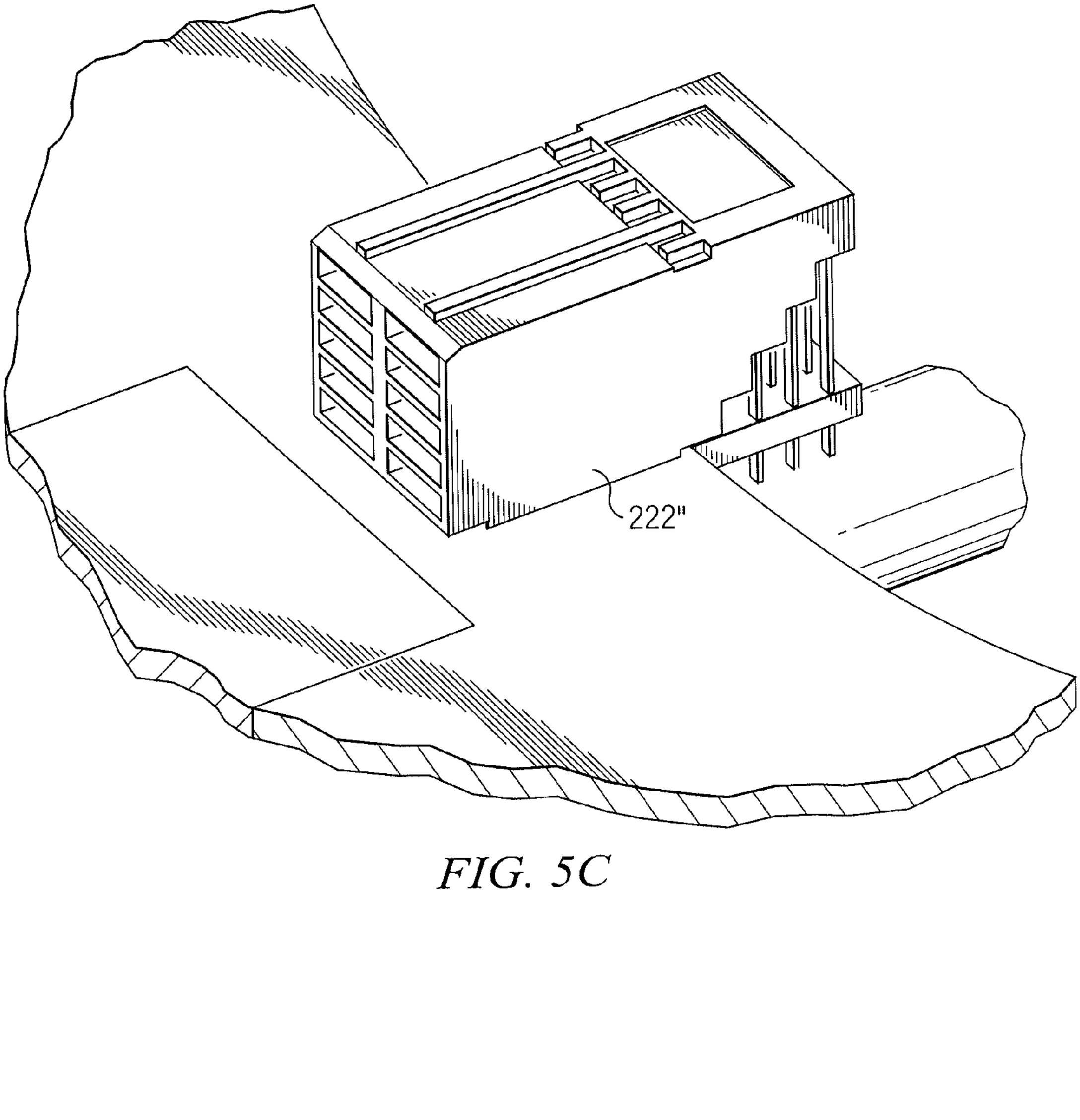

FIGS. 5A-5C show additional views of antenna system 200 according to one embodiment. FIG. 5A shows heat pipes 260 disposed within body 210 and extending to antenna plate 232. Heat pipes 260 may be secured within body 210 by heat pipe restraints 262.

FIG. 5B shows antenna plate 232. In this example, antenna plate 232 includes openings for antenna modules 220 to contact and be in thermal communication with heat pipes 260. In another example embodiment, antenna plate 232 does not include openings, and antenna modules 220 are in thermal communication with heat pipes 260 through antenna plate 232.

FIG. 5C shows another example of an antenna port 222". Teachings of certain embodiments recognize that antenna ports may be configured to connect to any suitable antenna module 220. In another example embodiment, antenna modules 220 may be TRIMM cards, and antenna ports 222" may be configured to receive TRIMM cards.

Figure 6A:
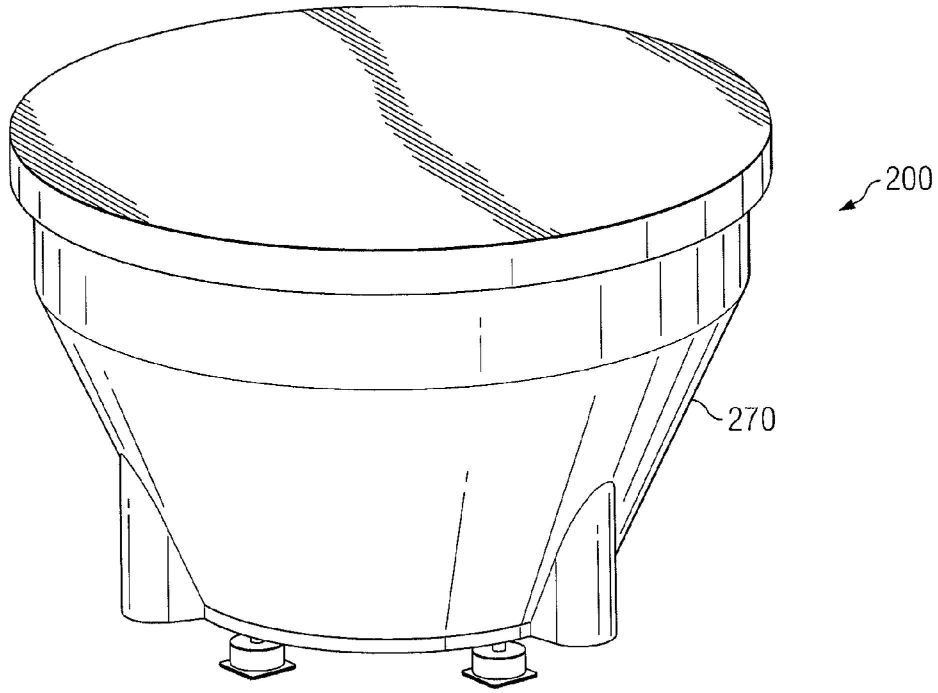
FIGS. 6A and 6B show an antenna system with an example radome according to one embodiment.
Figure 6B:
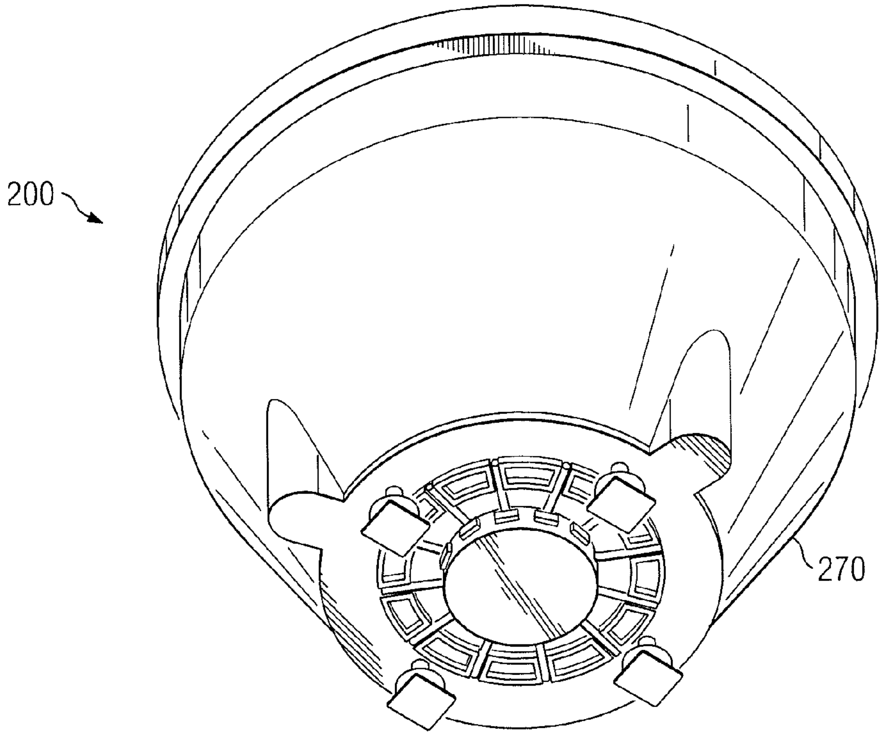

FIGS. 6A and 6B show antenna system 200 with an example radome 270. A radome may include any protective cover. In some examples, a radome may be constructed from material that minimally attenuates the electromagnetic signal transmitted or received by the antenna. Radomes may protect antenna system 200 from the environment (e.g., wind, rain, ice, sand, and ultraviolet rays) and/or conceal antenna system 200 from public view. Teachings of certain embodiments recognize that radome 270 may include openings to facilitate flow of fluid 205 into and out of antenna system 200.

Modifications, additions, or omissions may be made to the systems and apparatuses described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. Additionally, operations of the systems and apparatuses may be performed using any suitable logic. As used in this document, "each" refers to each member of a set or each member of a subset of a set.

Although several embodiments have been illustrated and described in detail, substitutions and alterations are possible without departing from the spirit and scope of the present invention, as defined by the appended claims.

To aid the Patent Office, and any readers of any patent issued on this application in interpreting the claims appended hereto, applicants wish to note that they do not intend any of the appended claims to invoke paragraph 6 of 35 U.S.C. §112 as it exists on the date of filing hereof unless the words "means for" or "step for" are explicitly used in the particular claim.

What is claimed is:

1. An antenna cooling system, comprising:

a first cylinder;

a second cylinder substantially concentric to the first cylinder, and forming a chamber between the first cylinder and the second cylinder, the chamber configured to receive a fluid flow;

a plurality of fins disposed within the chamber and rigidly coupled to the first cylinder and the second cylinder, the plurality of fins configured to transmit thermal energy to the fluid flow; and a plurality of ports coupled to the second cylinder, each port configured to receive an antenna unit.

2. The antenna cooling system of claim 1, each port of the plurality of ports coupling to the second cylinder opposite from a corresponding fin of the plurality of fins.

3. The antenna cooling system of claim 1, further comprising a plurality of feedlines, each feedline of the plurality of feedlines aligned parallel with a corresponding fin of the plurality of fins, the plurality of feedlines configured to electronically couple the plurality of ports to electronics disposed within the first cylinder.

4. The antenna cooling system of claim 1, further comprising a power supply disposed within the first cylinder.

5. The antenna cooling system of claim 1, further comprising a cylinder cover coupled to the first cylinder and configured to prevent at least some of the fluid flow from entering the first cylinder.

6. The antenna cooling system of claim 1, each port configured to receive a transmit/receive integrated microwave module (TRIMM) card.

7. The antenna cooling system of claim 1, further comprising a flow diverter coupled to the second cylinder and configured to:

receive the fluid flow in a first direction;

direct the fluid flow in a second direction substantially perpendicular to the first direction; and provide the fluid flow to the chamber in the second direction.

8. A method of cooling an antenna system, comprising:

receiving a fluid flow through a chamber, the chamber formed between a first cylinder and a second cylinder substantially concentric to the first cylinder;

transferring thermal energy from a plurality of fins to the fluid flow, the plurality of fins disposed within the chamber and rigidly coupled to the first cylinder and the second cylinder; and electronically communicating with a plurality of antenna units through a plurality of ports of the second cylinder, each port configured to receive an antenna unit.

9. The method of claim 8, each port of the plurality of ports coupling to the second cylinder opposite from a corresponding fin of the plurality of fins.

10. The method of claim 8, electronically communicating with the plurality of antenna units comprising electronically coupling the plurality of ports to electronics disposed within the first cylinder.

11. An antenna cooling system, comprising:

a first cylinder;

a second cylinder substantially concentric to the first cylinder, and forming a chamber between the first cylinder and the second cylinder, the chamber configured to receive a fluid flow;

a plurality of fins disposed within the chamber and rigidly coupled to the first cylinder and the second cylinder, the plurality of fins configured to transmit thermal energy to the fluid flow; and a plurality of heat pipes disposed between the first cylinder and the second cylinder, the plurality of heat pipes configured to be in thermal communication with a plurality of antenna units.

12. The antenna cooling system of claim 11, further comprising:

a control circuit card disposed within the first cylinder; and a plurality of feedlines configured to electronically couple the control circuit card to the plurality of antenna units.

13. The antenna cooling system of claim 11, further comprising a power supply disposed within the first cylinder.

14. The antenna cooling system of claim 11, further comprising an EMI filter disposed within the first cylinder.

15. The antenna cooling system of claim 11, further comprising a cylinder cover coupled to the first cylinder and configured to prevent at least some of the fluid from entering the first cylinder.

16. The antenna cooling system of claim 11, further comprising a flow diverter coupled to the second cylinder and configured to:

receive the fluid flow in a first direction;

direct the fluid flow in a second direction substantially perpendicular to the first direction; and provide the fluid flow to the chamber in the second direction.

17. The antenna cooling system of claim 11, further comprising a flow diverter coupled to the second cylinder and configured to:

receive the fluid flow from the chamber in a first direction; and direct the fluid flow in a second direction substantially perpendicular to the first direction.

18. A method of cooling an antenna system, comprising:

receiving a fluid flow through a chamber, the chamber formed between a first cylinder and a second cylinder substantially concentric to the first cylinder;

transferring thermal energy from a plurality of fins to the fluid flow, the plurality of fins disposed within the chamber and rigidly coupled to the first cylinder and the second cylinder; and transferring thermal energy from a plurality of heat pipes to the fluid flow, the plurality of heat pipes disposed between the first cylinder and the second cylinder, the plurality of heat pipes in thermal communication with a plurality of antenna units.

19. The method of claim 18, further comprising:

receiving the fluid flow in a first direction;

directing the fluid flow in a second direction substantially perpendicular to the first direction; and providing the fluid flow to the chamber in the second direction.

20. The method of claim 18, further comprising:

receiving the fluid flow from the chamber in a first direction; and directing the fluid flow in a second direction substantially perpendicular to the first direction.

* * * * *